United States Patent
Hayashi et al.

(10) Patent No.: US 9,550,194 B2
(45) Date of Patent: Jan. 24, 2017

(54) GAS SHOWER STRUCTURE AND SUBSTRATE PROCESSING APPARATUS

(75) Inventors: Daisuke Hayashi, Yamanashi (JP); Koichi Murakami, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 528 days.

(21) Appl. No.: 13/020,104

(22) Filed: Feb. 3, 2011

(65) Prior Publication Data
US 2011/0186229 A1 Aug. 4, 2011

Related U.S. Application Data

(60) Provisional application No. 61/307,609, filed on Feb. 24, 2010.

(30) Foreign Application Priority Data

Feb. 4, 2010 (JP) .................. 2010-023509

(51) Int. Cl.
C23C 16/455 (2006.01)
B05B 1/18 (2006.01)
C23C 16/00 (2006.01)
C23F 1/08 (2006.01)

(52) U.S. Cl.
CPC ............... *B05B 1/18* (2013.01); *C23C 16/00* (2013.01); *C23C 16/455* (2013.01); *C23F 1/08* (2013.01)

(58) Field of Classification Search
CPC ............ B05B 1/18; C23F 1/08; C23C 16/00
See application file for complete search history.

(56) References Cited

U.S. PATENT DOCUMENTS

| | | | | |
|---|---|---|---|---|
| 1,919,205 A | * | 7/1933 | Halloy ................ | 411/278 |
| 3,175,454 A | * | 3/1965 | Morse ................ | 411/542 |
| 4,784,555 A | * | 11/1988 | Cantrell ............. | 411/431 |
| 5,520,142 A | * | 5/1996 | Ikeda et al. ........ | 118/733 |
| 5,569,356 A | | 10/1996 | Lenz et al. | |
| 5,676,757 A | * | 10/1997 | Ikeda et al. ........ | 118/733 |

(Continued)

FOREIGN PATENT DOCUMENTS

CN 1184555 A 6/1998
CN 101296553 A * 10/2008

(Continued)

OTHER PUBLICATIONS

JP 2005-276850 Translation by Machine.*

*Primary Examiner* — Jeffrie R Lund
*Assistant Examiner* — Yuechuan Yu
(74) *Attorney, Agent, or Firm* — Pearne & Gordon LLP

(57) ABSTRACT

Screws 4 are inserted from a bottom surface of a ceiling plate 32 and screwed to a base plate 31, and the ceiling plate 32 and the base plate 31 are press-connected to each other by an elastic restoring force of an elastic member 51 interposed between a head of the screw 4 and the ceiling plate 32. A gap is formed between the head and the ceiling plate 32. Further, a periphery of the head is covered with a cover via a ring-shaped elastic member 52. In another embodiment, a periphery of a base plate 31 is protruded from a periphery of a ceiling plate 32, and the protruded portion of the base plate 31 and a ring-shaped clamp positioned at an outer side of the ceiling plate 32 are joined by screws. Here, an elastic member is interposed between the clamp and the ceiling plate 32.

8 Claims, 9 Drawing Sheets

(56) References Cited

U.S. PATENT DOCUMENTS

| | | | |
|---|---|---|---|
| 5,791,848 A * | 8/1998 | Lanham | 411/373 |
| 6,096,161 A * | 8/2000 | Kim et al. | 156/345.47 |
| 6,916,399 B1 * | 7/2005 | Rozenzon et al. | 156/345.37 |
| 2004/0157035 A1 * | 8/2004 | Guizzetti et al. | 428/66.6 |
| 2005/0003600 A1 * | 1/2005 | Kasai et al. | 438/200 |
| 2007/0022954 A1 * | 2/2007 | Iizuka et al. | 118/724 |
| 2007/0227661 A1 * | 10/2007 | Horiguchi | 156/345.41 |
| 2008/0303744 A1 | 12/2008 | Hirayama et al. | |

FOREIGN PATENT DOCUMENTS

| | | | |
|---|---|---|---|
| CN | 101370350 A | | 2/2009 |
| CN | 201322037 | | 10/2009 |
| GB | WO 2007096664 | * | 8/2007 |
| JP | 07-273095 A | | 10/1995 |
| JP | 08250465 A | * | 9/1996 |
| JP | 11-111626 A | | 4/1999 |
| JP | 2001-135499 A | | 5/2001 |
| JP | 2004-356509 A | | 12/2004 |
| JP | 2005-276850 | * | 10/2005 |
| JP | 2007067208 A | * | 3/2007 |
| JP | 2008192513 A | * | 8/2008 |
| JP | 2009-016668 A | | 1/2009 |
| JP | 2009191979 A | * | 8/2009 |
| JP | 2009-278062 A | | 11/2009 |
| KR | 2005116230 A | * | 12/2005 |

* cited by examiner

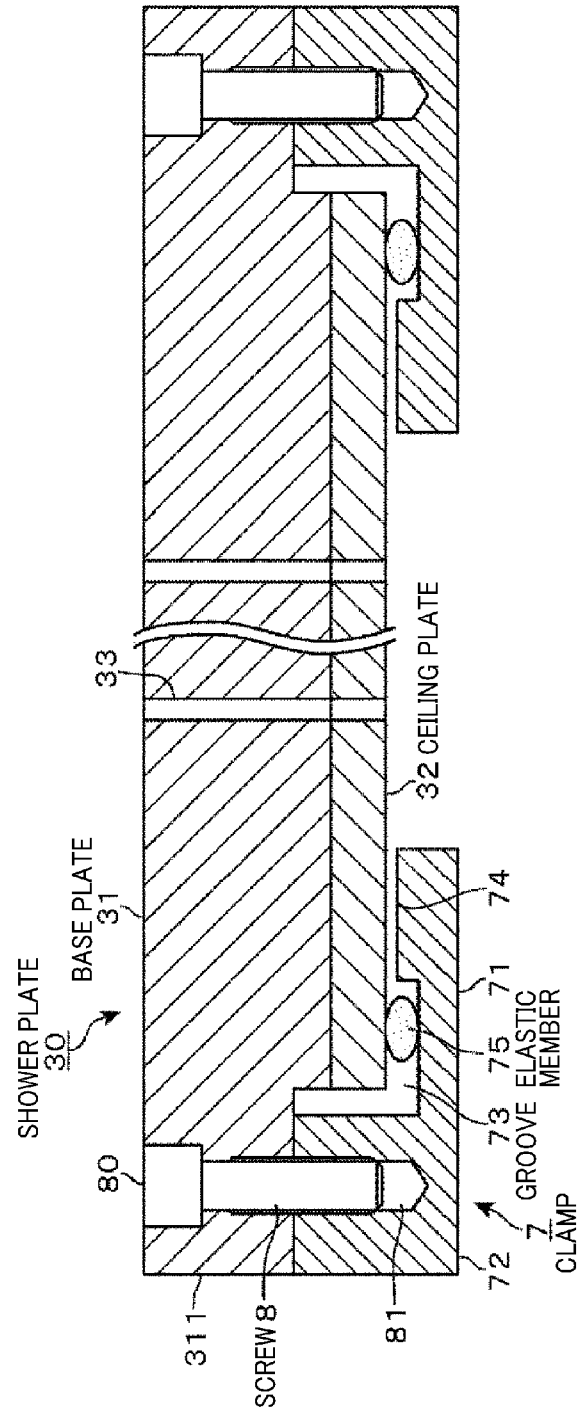

GAS SHOWER STRUCTURE AND SUBSTRATE PROCESSING APPARATUS

CROSS-REFERENCE TO RELATED APPLICATION

This application claims the benefit of Japanese Patent Application No. 2010-023509 filed on Feb. 4, 2010 and U.S. Provisional Application Ser. No. 61/307,609 filed on Feb. 24, 2010, the entire disclosures of which are incorporated herein by reference.

FIELD OF THE INVENTION

The present disclosure relates to a gas shower structure that is disposed so as to face a substrate in an apparatus for performing a process on the substrate by supplying a gas to the substrate.

BACKGROUND OF THE INVENTION

As for an apparatus used for manufacturing semiconductor devices, there has been known a so-called single-wafer processing apparatus for performing a process on a substrate one by one. Specifically, the process may include a plasma process such as a CVD (chemical vapor deposition) process or an etching process, or heat treatment such as a thermal CVD process. Generally, since the apparatus is configured to perform such processes under a vacuum atmosphere, a mounting table is provided in a processing chamber as a vacuum chamber and a gas shower structure is configured to dispose so as to face the mounting table and supply a processing gas onto a substrate, as in a shower device.

FIG. 10 is a schematic view for describing a general structure of a vacuum processing apparatus. In FIG. 10, a reference numeral 101 denotes a processing chamber; a reference numeral 102 denotes a mounting table for mounting thereon a substrate 103; a reference numeral 104 denotes a gas shower head serving as a ceiling plate of the processing chamber 101; and a reference numeral 105 denotes a gas exhaust line for performing evacuation. The gas shower head 104 may include a cover 106 for airtightly covering an opening formed on a top surface of the processing chamber 101 via a non-illustrated sealing member; and a shower plate 107. A processing gas is introduced into a diffusion space 109 through a gas inlet port 108 and the introduced processing gas is supplied through gas inlet holes 100 of the shower plate 107, as in a shower device.

The shower plate 107 is formed by stacking two plates made of different materials. A base plate 110 as an upper plate is made of a metal such as aluminum (Al) or stainless steel (SUS). A ceiling plate 111 as a lower plate is made of silicon (Si), silicon carbide (SiC), quartz or the like. By using two plates, the shower plate 107 can be prevented from being deformed by stress caused by depressurization when a process is performed under a processing atmosphere in a vacuum level, and a portion of the shower plate 107 which is exposed to the processing atmosphere can be protected from metal contamination. Especially, in a plasma process, the plasma resistance of the shower plate 107 can be further improved by using the two plates.

As for a structure for joining the base plate 110 and the ceiling plate 111, there has been known a structure illustrated in FIGS. 11A and 11B, for example. In the structure of FIG. 11A, the outer periphery of the base plate 110 is protruded from the outer periphery of the ceiling plate 111. The base plate 110 and a ring-shaped clamp 112 are press-connected to each other via the ceiling plate 111 disposed therebetween by a screw 113. The clamp 112 is made of a metal, and the clamp 112 may include a portion facing the protruded portion of the base plate 110; and a portion covering a periphery of a rear surface of the ceiling plate 111. Meanwhile, in the structure of FIG. 11B, the base plate 110 and the ceiling plate 111 are joined to each other at the peripheries thereof by a screw 114 inserted from the ceiling plate 111.

However, in the structure using the clamp 112, since the base plate 110 and the clamp 112 are press-connected each other via the ceiling plate 111 by the screw 113, a gap is structurally required between the clamp 112 and the base plate 110. A pressing force is controlled as a screw torque by using this gap. Thus, the screw torque needs to be controlled strictly such that the screw 114 is prevented from being excessively tightened or loosened, and assembly errors may lead to non-uniformity of performance (non-uniformity of the pressing force). Further, the clamp 112 is made of a metal because the metal can be easily processed. However, since the ceiling plate 111 and the clamp 112 are made of different materials, a thermal expansion difference therebetween causes friction at a contact area S. Accordingly, particles may be generated at the friction area and introduced into the processing atmosphere.

A temperature of the shower plate 107, which is an important process parameter, is controlled by a unit above the shower plate 107, e.g., outside of the gas shower head 104. Since, however, the gap is formed between the clamp 112 and the base plate 110, a thermal conductivity therebetween is decreased. Further, when the shower plate 107 is used as an electrode in a plasma process, an electrical conduction becomes poor. If the thermal conductivity or an electrical conduction become poor, the uniformity of the heat or an electric field between the shower plate 107 and a vicinity thereof is decreased, resulting in deteriorating the uniformity in a surface of the substrate in the plasma process.

Meanwhile, in the structure of FIG. 11B, the base plate 110 and the ceiling plate 111 are press-connected each other by the screw 114, so that the screw torque needs to be controlled strictly. Besides, the ceiling plate 111 and the screw 114 are respectively made of ceramic and metal as described above, and, thus, a screw hole needs to be formed at the base plate 110. Accordingly, the thermal expansion difference between the screw 114 and the ceiling plate 111 causes friction at a contact area S, which results in the above-described problems. Moreover, in order to protect a head of the screw 114, a ring-shaped cover may be formed around the ceiling plate 111 in a circumferential direction. In such a case, however, if the cover is scaled-up, selection of materials having a high plasma resistance is limited. In addition, since the gap exists between the cover and the ceiling plate 111, the screw 114 is damaged by plasma introduced through the gap. As a consequence, the loosening or breakage of the screw 114 may occur.

Patent Document 1 discloses a structure for joining a conductive plate having a plurality of holes and a support structure via an electrical-connection member having elasticity by a screw. However, the thermal conduction or the electrical conduction between the conductive plate and the support structure is locally carried out via the electrical-connection member, so that the conduction is not effective. Moreover, the thermal expansion difference between the screw and a spacer and between the spacer and the conductive plate causes friction, which may lead to introduction of particles into the processing atmosphere.

Patent Document 2 discloses a structure for joining a gas shower plate and a lower part of a high frequency electrode via a spiral-shaped metal tube. However, if a screw is inserted from the gas shower plate, the same problems of the structure shown in FIG. 11B may occur.

Patent Document 1: Japanese Patent Laid-open Publication No. 2001-135499 (FIG. 1)

Patent Document 2: Japanese Patent Laid-open Publication No. 2004-356509 (FIGS. 1 and 3)

BRIEF SUMMARY OF THE INVENTION

In view of the foregoing, the present disclosure provides a gas shower structure that is provided in a processing chamber for performing a process on a substrate by using a gas and formed by stacking a base member and a plate-shaped member exposed to a processing atmosphere. In this gas shower structure, it is possible to set a pressing force between the base member and the plate-shaped member to a proper level without being affected by assembly errors, and it is possible to prevent particle contamination caused by friction between the plate-shaped member and a joining member for joining the base member and the plate-shaped member.

In accordance with one aspect of the present disclosure, there is provided a gas shower structure that is provided to face a substrate within a processing chamber and supplies a processing gas to the substrate as in a shower device. The gas shower structure includes a plate-shaped member disposed so as to be exposed to a processing atmosphere and having a plurality of gas discharge holes; a base member stacked on and press-connected to the plate-shaped member and having gas discharge holes at positions corresponding to positions of the gas discharge holes of the plate-shaped member; a joining member for press-connecting the plate-shaped member sandwiched between the joining member and the base member to the base member; and a press-connecting elastic member interposed between the joining member and a surface of the plate-shaped member on the side of the processing atmosphere, and deformed to have an elastic restoring force when the joining member approaches the plate-shaped member. Here, the plate-shaped member is press-connected to the base member by the elastic restoring force of the elastic member, and a gap is formed between the joining member and the surface of the plate-shaped member on the side of the processing atmosphere.

Specifically, the following configurations can be employed.

(1) The joining member may include a screw inserted from the plate-shaped member and screwed to the base member, and the elastic member may be interposed between the head portion of the screw and the plate-shaped member.

(2) The outer periphery of the base member may be a protruded portion that is protruded from the outer periphery of the plate-shaped member. The joining member may include: a clamp having an inner portion formed to allow an outer periphery of the plate-shaped member to be sandwiched between the inner portion and the base member and an outer portion press-connected to the protruded portion of the base member; and a screw inserted from the protruded portion of the base member and screwed to the outer portion of the clamp for press-connecting and joining the protruded portion with the outer portion of the clamp. The press-connecting elastic member may be interposed between the clamp and the plate-shaped member.

In accordance with another aspect of the present disclosure, there is provided a substrate processing apparatus including a processing chamber accommodating therein a substrate mounting table; the above-mentioned gas shower structure; a gas supply unit for supplying a processing gas through gas discharge holes of the gas shower structure; and a vacuum exhaust unit for exhausting an inside of the processing chamber.

In accordance with the present disclosure, the gas shower structure is formed by stacking the base member on the plate-shaped member exposed to the processing atmosphere and supplies the gas as in a shower device. The joining member is provided at the surface of the plate-shaped member on the side of the processing atmosphere, and the plate-shaped member is sandwiched between the joining member and the base member. Further, the elastic member is interposed between the plate-shaped member and the joining member, and the plate-shaped member is press-connected to the base member by the elastic restoring force, and a gap is formed between the joining member and the plate-shaped member. Accordingly, it is possible to set a pressing force between the base member and the plate-shaped member to a proper level without being affected by assembly errors, and it is possible to prevent particle contamination caused by friction between the plate-shaped member and the joining member for joining the base member and the plate-shaped member.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 6 is a longitudinal cross sectional view showing another example of the gas shower structure.

DETAILED DESCRIPTION OF THE INVENTION

Figure 1:
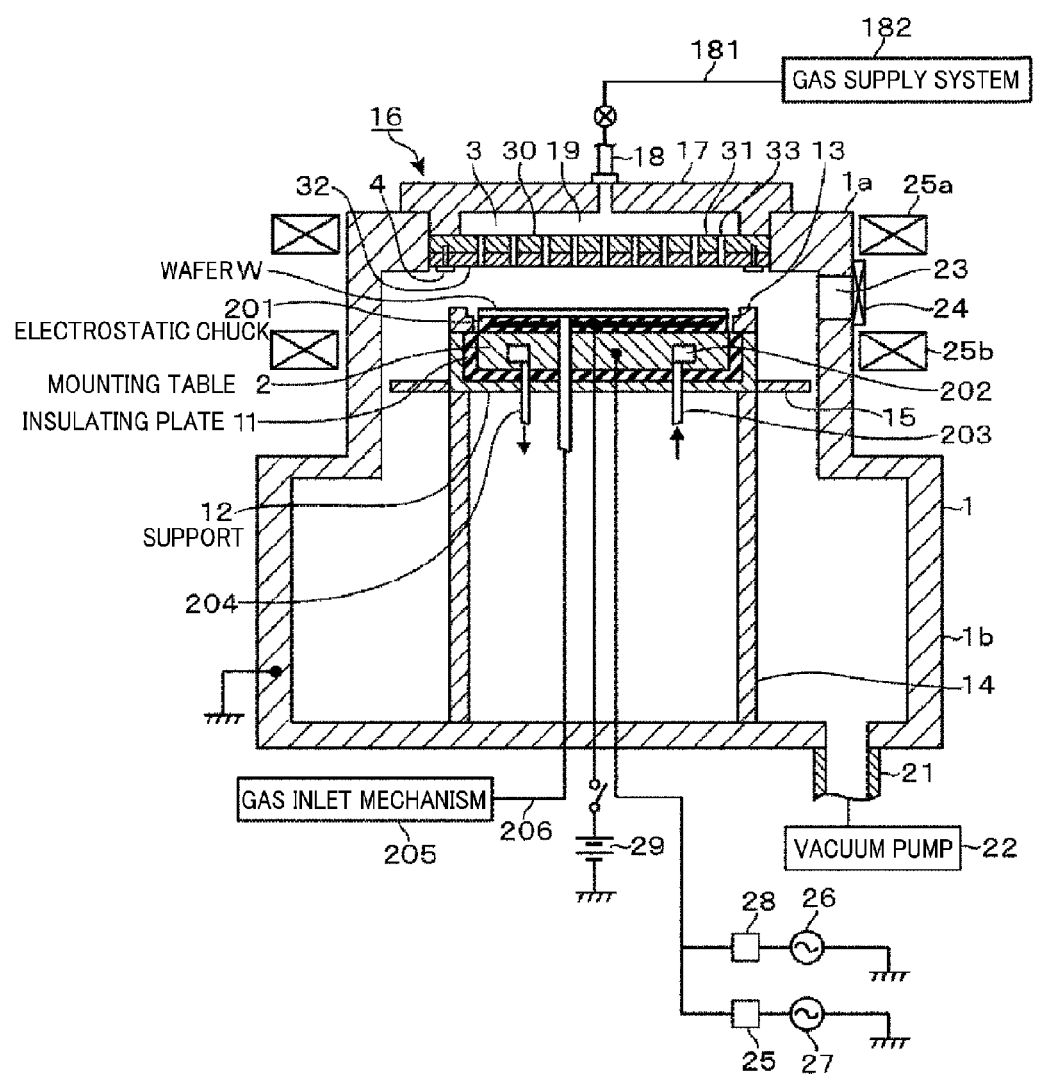
FIG. 1 shows an entire configuration of a substrate processing apparatus in accordance with an embodiment of the present disclosure.

Hereinafter, an example of a substrate processing apparatus including a gas shower structure in accordance with an embodiment of the present disclosure will be described. FIG. 1 shows an entire configuration of a substrate processing apparatus. This substrate processing apparatus is configured as a reactive ion etching (RIE) plasma etching apparatus. First of all, the entire configuration of the substrate processing apparatus will be briefly described. A reference numeral 1 in FIG. 1 denotes an airtight processing chamber (vacuum chamber) made of, e.g., aluminum. The processing chamber 1 may include a cylindrical upper portion 1a having a small diameter; and a cylindrical lower portion 1b having a large diameter. Provided in the processing chamber 1 is a mounting table 2 for horizontally mounting thereon a semiconductor wafer W (hereinafter, referred to as a "wafer") as a substrate and the mounting table 2 serves as a lower electrode. The mounting table 2 is made of, e.g., aluminum, and is supported by a conductive support 12 via an insulating plate 11. Further, a focus ring 13 made of, e.g., silicon (Si), is disposed on a periphery of a top surface of the mounting table 2. A lower portion of the support 12 is covered by a cover 14 and a baffle plate 15 is installed at an outer side of the support 12.

Provided at a ceiling of the processing chamber 1 is a gas shower head 16 serving as a gas supply unit for supplying a processing gas into the processing chamber 1. The gas shower head 16 may include a cover 17 made of, e.g., aluminum, for covering an opening formed on a top surface of the processing chamber 1; and a gas shower structure 3 in accordance with an embodiment of the present disclosure which is provided under the cover 17 via a gas diffusion space. The gas shower structure 3 may include a shower plate 30 which is formed by stacking a base plate 31 and a ceiling plate 32 and has a plurality of gas discharge holes 33; and a screw 4 for press-connecting and joining the base plate 31 and the ceiling plate 22. The description of the gas shower structure 3 will be provided later.

A gas inlet port 18 is provided at an upper portion of the gas shower head 16, and a diffusion space 19 is formed within the gas shower head 16. The gas inlet port 18 is connected to one end of a gas supply line 181. The other end of the gas supply line 181 is connected to a gas supply system 182 for supplying a processing gas.

The shower plate 30 serving as an upper electrode is provided so as to face the mounting table 2 serving as a lower electrode in parallel. The shower plate 30 and the mounting table 2 function as a pair of electrodes. A gas exhaust port 21 is formed at a bottom wall of the lower portion 1b of the processing chamber 1 and is connected to a vacuum pump 22. A reference numeral 23 in FIG. 1 denotes a loading/unloading port which is opened and closed by a gate valve 24.

The mounting table 2 is connected to a first high frequency power supply 26 for plasma generation via a matcher 28 and also connected to a second high frequency power supply 27 for ion attraction via a matcher 25. On a surface of the mounting table 2, an electrostatic chuck 201 for adsorptively holding the wafer W thereon is installed and is driven by a DC power supply 29. A cooling path 202 is provided within the mounting table 2. A coolant is introduced into the cooling path 202 through a coolant inlet line 203 and then discharged through a coolant discharge line 204. By circulating the coolant, a cold heat is transferred to the wafer W through the mounting table 2. Accordingly, a processing surface of the wafer W is controlled to a desired temperature. A reference numeral 205 in FIG. 1 represents a gas inlet mechanism. The gas inlet mechanism 205 is configured to introduce a heat transfer gas to a space between a surface of the electrostatic chuck 201 and a backside of the wafer W via a gas supply line 206.

Two dipole ring magnets 25a and 25b are disposed around the upper portion 1a of the processing chamber 1 with the loading/unloading port 23 interposed therebetween in order to form a magnetic field at a vicinity of a processing space between the upper and the lower electrode and confine plasma within the processing space.

Figure 2:
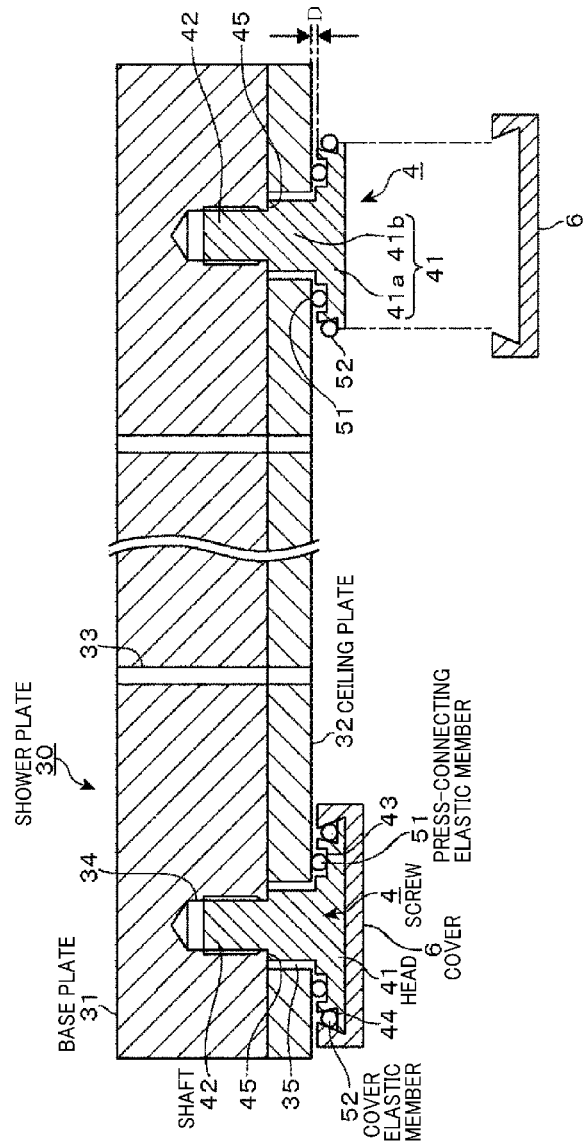
FIG. 2 is a longitudinal cross sectional view of a gas shower structure.

Hereinafter, a configuration of the gas shower structure 3 will be described in detail. As shown in FIGS. 1 and 2, the gas shower structure 3 is formed by stacking a circular base plate 31 and a circular ceiling plate 32 having a diameter same as that of the base plate 31. The base plate 31 and the ceiling plate 32 respectively correspond to a base member and a plate-shaped member in claims. The base plate 31 may be made of a metal such as aluminum and have a thickness of about 20 mm. The ceiling plate 32 may be made of a material having a high plasma resistance, e.g., ceramic such as silicon carbide (SiC), silicon nitride or quartz. Alternatively, the ceiling plate may be made of silicon having little influence on semiconductor devices even if components of the ceiling plate 32 are diffused by collision with the plasma. Moreover, the ceiling plate 32 may have a thickness of, e.g., about 3 mm to about 10 mm. A plurality of gas discharge holes 33 is respectively formed at corresponding positions in the base plate 31 and the ceiling plate 32. For the simplicity of reference numerals, the gas discharge holes formed in the base plate 31 and the ceiling plate 32 are denoted by a common reference numeral 33. Furthermore, for the convenience of explanation, the stacked structure of the base plate 31 and the ceiling plate 32 is referred to as the shower plate 30. In the shower plate 30, the base plate 31 may have the function of preventing deformation caused by stress due to depressurization, and the ceiling plate 32 may have the function of preventing dispersion of particles or heavy metals exposed to the processing atmosphere.

By way of example, the gas discharge holes 33 may be arranged in a concentric circular pattern or a matrix pattern on the shower plate 30. By forming the gas discharge holes 33 on the shower plate 30, the gas diffused in the diffusion space 19 is supplied to the processing atmosphere, as in a shower device.

Figure 3:
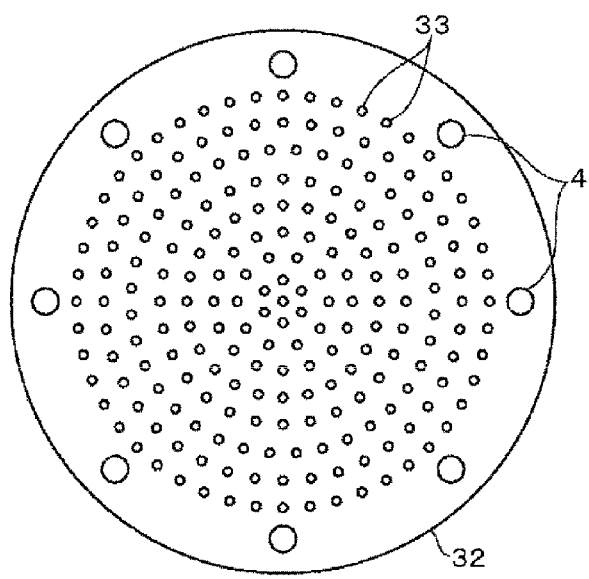
FIG. 3 is a bottom view showing an example of the gas shower structure of the substrate processing apparatus.

By way of example, the base plate 31 and the ceiling plate 32 are joined to each other by the screws 4 made of a metal, as joining members. The screws 4 are inserted from a bottom surface of the ceiling plate 32 and screwed to screw holes 34 of the base plate 31 at a plurality of locations on a periphery (vicinity of the periphery) of the ceiling plate which are equi-spaced apart from each other in the circumferential direction. FIG. 3 shows a state in which the ceiling plate 32 is joined to the base plate 31 by the screws 4 when viewed from the bottom. In this embodiment, the base plate 31 and the ceiling plate 32 are joined to each other by the screws 4 at eight locations.

Figure 4:
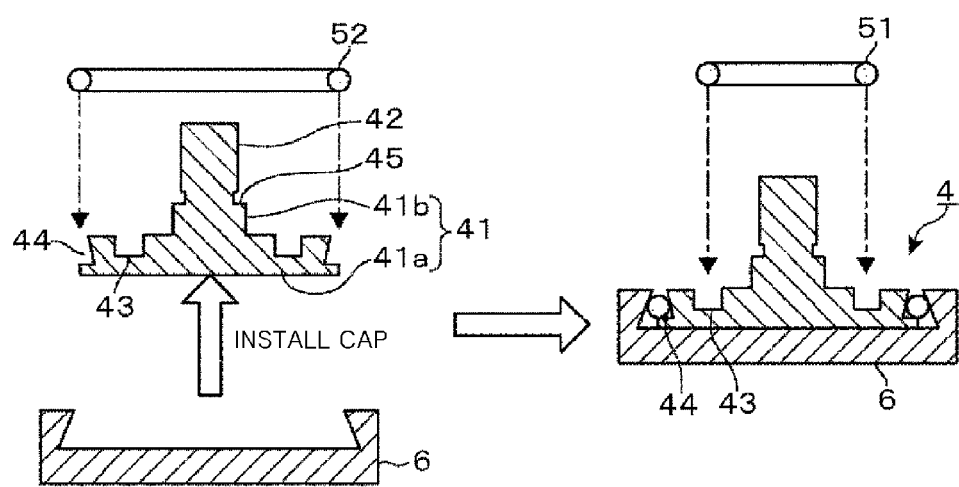
FIG. 4 is an exploded cross sectional view of a screw and a cover used in the gas shower structure.

As shown in FIGS. 2 and 4, each of the screw 4 may include head 41 and shaft 42. The head 41 has a circular flat portion 41a having a large diameter (see a right side of FIG. 2) and a cylindrical portion 41b having a diameter smaller than that of the flat portion 41a and larger than that of the shaft 42. The cylindrical portion 41b is protruded from a center of the flat portion 41a toward the shaft 42. Further, formed in the ceiling plate 32 are through holes 35 having a diameter slightly larger than that of the cylindrical portion 41b of the screw 4. When the screw 4 is screwed to the screw hole 34 of the base plate 31, the cylindrical portion 41b is inserted into the through hole 35 of the ceiling plate 32. When the screw 4 is tightened, a ring-shaped surface 45 of the cylindrical portion 41b on the side of the shaft 42 contacts with a bottom surface of the base plate 31 which is exposed through the through hole 35. Here, the ring-shaped surface 45 serves as a stop surface.

As shown in FIGS. 2 and 4, a ring-shaped groove 43 is formed on the surface of the flat portion 41a of the head 41 of the screw 4 on the side of the shaft 42 (the surface facing the ceiling plate 32) so as to surround the shaft 42, and a cut-off portion 44 are formed at the outer side of the groove 43 by cutting the periphery to have a depth larger than that of the groove 43.

Further, a pressing elastic member 51 is formed in a ring shape corresponding to the groove 43 and is provided in the groove 43. The elastic member 51 sticks out of the groove 43 when not deformed. On the contrary, when the head 41 approaches the ceiling plate 32 by tightening the screw 4, the elastic member 51 is pressed and deformed between the flat portion 41a of the head 41 and the ceiling plate 32. The ceiling plate 32 is pressed toward the base plate 31 by an elastic restoring force of the elastic member 51, so that the ceiling plate 32 and the base plate 31 are joined while being press-connected to each other. When the screw 4 is tightened to the maximum, a gap is formed between the ceiling plate 32 and the flat portion 41a of the head 41 of the screw 4.

In this embodiment, a size of each part of the screw is set such that, when the proper tightening state is obtained, the stop surface (ring-shaped surface) of the cylindrical portion 41 of the screw 4 contacts with the bottom surface of the base plate 31 without being inserted into the base plate 31. Accordingly, by tightening the screw 4 until the stop surface 45 of the screw 4 contacts with the base plate 31, a proper tightening state, i.e., a proper pressing force between the ceiling plate 32 and the base plate 31 can be constantly obtained.

As illustrated in the right side of FIG. 2, a dimension D of the gap is preferably set to be, e.g., about 0.2 mm or less, in order to minimize damages on the elastic member 51 by contact with the processing atmosphere, e.g., the plasma in this embodiment, by preventing entrance of the plasma from the processing atmosphere. As seen from the above, it is desirable to minimize the dimension of the gap. However, when the ceiling plate 32 is heated by the plasma, the thermal expansion difference occurs between the screws 4 and the ceiling plate 32. Accordingly, it is required to maintain a gap having a dimension that prevents friction between the screws 4 and the ceiling plate 32.

As described above, in this embodiment, the screws 4 serve as joining members for press-connecting the ceiling plate 32 to the base plate 31 by interposing the ceiling plate 32 between the screws 4 and the base plate 31. The head 41 of the screw 4 is covered by cover (cap) 6 from the side opposite to the shaft 42, and an inner surface of the cover 6 becomes wider toward a bottom of the cover 6. By inserting a ring-shaped cover elastic member 52 into the cut-off portion 44 and then fitting the cover 6 against the elastic restoring force of the elastic member 52, the cover 6 is connected to the head 41 without being separated from the head 41 by the weight of the cover 6. In addition, a lower surface of the cover 6 and the head 41 can be adhered to each other by an adhesive layer (not shown). The elastic member 52 absorbs the thermal expansion difference between the screw 4 and the cover 6 and protect the head 41 and the adhesive layer (if exist) by preventing the plasma from reaching the top surface of the head 41 (bottom side in FIG. 2). Desirably, the cover 6 may be made of a material that prevents deterioration and damages by the processing atmosphere. In this embodiment, a material having a high plasma resistance, e.g., ceramic such as silicon carbide, silicon nitride or quartz may be used.

Figure 5A:
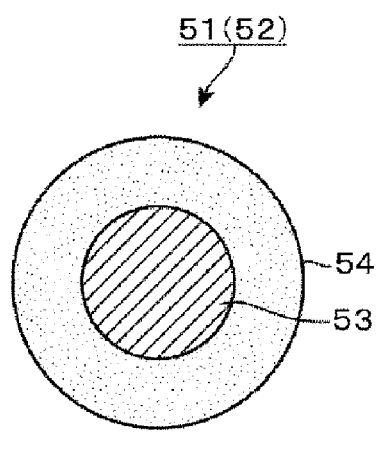
FIGS. 5A, 5B, 5C and 5D are cross sectional views of an example of an elastic member used in the gas shower structure.
Figure 5B:
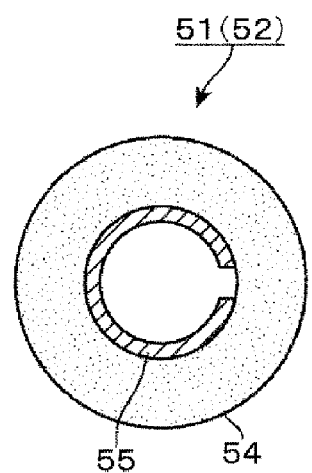
Figure 5C:
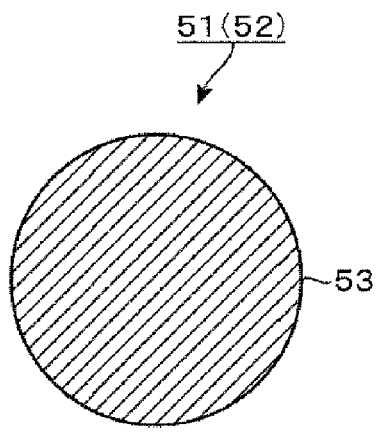
Figure 5D:
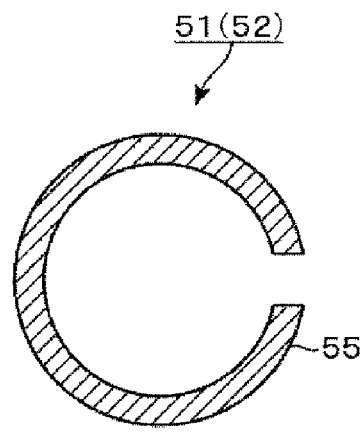

Here, it is desirable to use the elastic members 51 and 52 having a high plasma resistance on surfaces thereof, and it is desirable to use the elastic members 51 and 52 capable of preventing deterioration of an elastic restoring force (resilience force) by heat or elapse of time. Further, it is desirable to use the elastic members 51 and 52 capable of protecting a contact target member from scratches and it is desirable to use the elastic members 51 and 52 having a low surface frictional resistance. Meanwhile, the plasma may refer to active species such as ions, radicals or the like. Illustrative examples of the structure of the elastic members 51 and 52 are shown in FIGS. 5A, 5B, 5C and 5D. FIG. 5A shows an example in which a coating layer 54 is formed by coating, e.g., fluorine resin (e.g., Trademark 'Teflon' (Registered Trademark)) around an O-ring 53 as a core. FIG. 5B illustrates an example in which a slit is formed at a metal pipe made of, e.g., a stainless steel-based material in a longitudinal direction thereof, and a coating layer 54 is formed by coating, e.g., fluorine resin around a metal spring 55 as a core. Here, the metal spring 55 has one cut-off portion when viewed from a transversal cross section. Such structures are effectively used for processes using plasma. FIG. 5C depicts an example in which the O-ring 53 is used as an elastic member, which is one of structures that can be used when a plasma resistance is not required. FIG. 5D describes an example in which the metal spring 55 is used as an elastic member, which is effective when a strong elastic restoring force is required.

Hereinafter, an operation of the above-described plasma processing apparatus will be described. First of all, the gate valve 24 opens, and the wafer W is loaded into the processing chamber 1 via the loading/unloading port 23. Then, the wafer W is mounted on the mounting table 2, and the electrostatic chuck 201 electrostatically attracts the wafer W mounted on the mounting table 2. Next, the inside of the processing chamber 1 is exhausted to a predetermined vacuum level via the gas exhaust port 21 by the vacuum pump 22. A processing gas such as a fluorine (F) gas is supplied from the processing gas supply system 182 into the diffusion space 19 of the gas shower head 16 via the gas supply line 181 and the gas inlet port 18, and the processing gas is discharged to the processing atmosphere through the gas discharge holes 33. Then, a gas pressure within the processing chamber 1 is set to be a predetermined pressure (vacuum level). A high frequency power having a frequency of, e.g., about 100 MHz is applied from the first high frequency power supply 26 to the mounting table 2, thereby generating a high frequency electric field in a space (processing atmosphere) between the mounting table 2 and the ceiling plate 32.

Further, a high frequency power having a frequency of, e.g., about 3.2 MHz is applied from the second high frequency power supply 27 in order to control ion energy of the plasma. Since a horizontal magnetic field has been formed by the dipole ring magnets 25a and 25b in the processing atmosphere, an orthogonal electromagnetic field is generated in the processing space having therein the wafer W between the electrodes, and thus a magnetron discharge is generated due to an electron drift produced by the orthogonal electromagnetic field. As a result of the magnetron discharge, the processing gas is excited into plasma, and a film formed on the surface of the wafer W is etched by the plasma.

In the above embodiment, there is provided the structure for joining the base plate 31 and the ceiling plate 32 stacked on the base plate 31. In such a structure, the screws 4 are inserted from the ceiling plate 32 and screwed to the base plate 31, so that the base plate 31 and the ceiling plate 32 are press-connected to each other by the elastic restoring force of the elastic member 51 interposed between the head 41 of the screw 4 and the ceiling plate 32. Therefore, the torque of the screw 4 can be easily controlled compared to a case where the elastic member 51 is not interposed, and the pressing force between the base plate 31 and the ceiling plate 32 can be set to a proper level without being affected by assembly errors. Moreover, as described above, a size of each part of the screw 4 is set such that the stop surface of the screw 4 contacts with the bottom surface of the base plate 31 when the proper pressing state is obtained. Accordingly, the torque need not be controlled, which makes the assembly operation easier and allows the pressing force to be maintained at a constant level. Besides, the screws 4 are pressed downward by the elastic restoring force of the elastic member 51, so that the loosening of the screws 4 can be prevented.

As described above, the base plate 31 and the ceiling plate 32 is press-connected by the elastic member 51, so that the gap is formed between the head 41 of the screw 4 and the ceiling plate 32. Therefore, the friction caused by the thermal expansion difference therebetween can be avoided, and the generation of particles by the friction can be prevented. The generation of particles by the friction can be further prevented if at least the surface of the elastic member 51 is made of a material having a small friction coefficient. Even if the gap is increased by the thermal expansion, entrance of the plasma into the shaft 42 of the screw 4 can be prevented by the elastic member 51. Further, by covering the screw 4 with the cover 6, the contact between the processing atmosphere and the screw 4 is suppressed. Moreover, since the cover 6 is installed for each screw 4, the size can be reduced considerably compared to the case of installing a ring-shaped cover along the entire circumference of the ceiling plate 32, which leads to the increase in a degree of freedom in selecting materials. As described above, the plasma can be prevented from reaching the screws 4 by interposing the elastic member 52 between the cover 6 and the screw 4, and the friction caused by the thermal expansion difference between the cover 6 and the screw 4 can be avoided.

Figure 7:
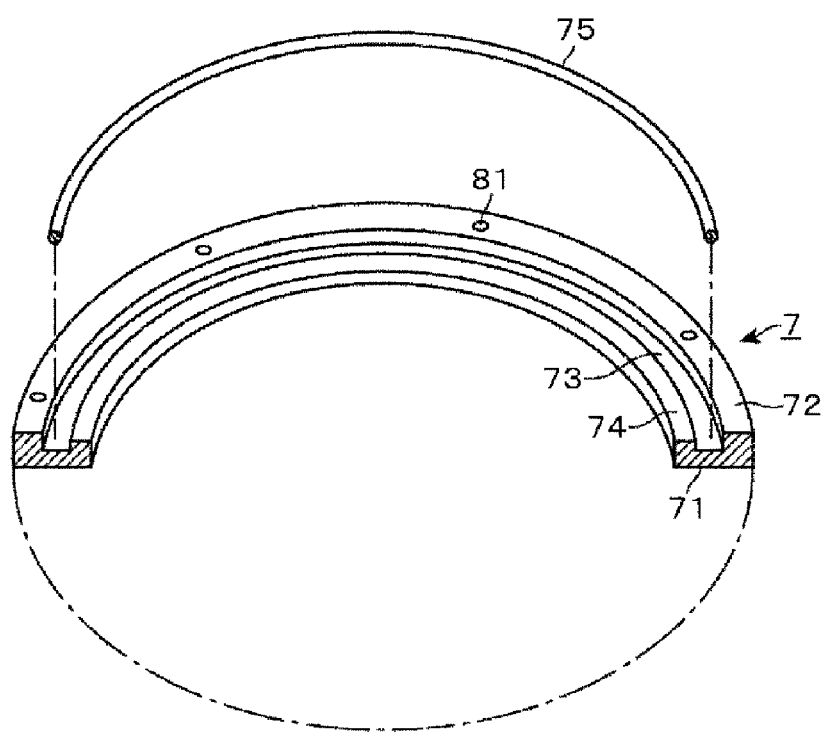
FIG. 7 is an exploded perspective view showing another example of the gas shower structure.

Another embodiment of a gas shower structure of the present disclosure will be described with reference to FIGS. 6 and 7. In this embodiment, a ring-shaped clamp 7 is installed at a bottom surface of an outer periphery of a shower plate 30 along an entire circumference of a shower plate 30. A periphery of a base plate 31 is formed as a protruded portion 311 that is protruded from an outer periphery of a ceiling plate 32, and a thickness of the protruded portion 311 is slightly smaller than that of a portion stacked on the ceiling plate 32. Accordingly, a bottom surface of the protruded portion 311 is positioned at a higher position than a top surface of the ceiling plate 32.

The clamp 7 may include an inner portion 71 facing the outer periphery of the ceiling plate 32; and an outer portion 72 that contacts with the bottom surface of the protruded portion 311 of the base plate 31. A ring-shaped groove 73 is formed at a position spaced outward from the inner circumference of the inner portion 71 by, e.g., about 20 mm along an entire circumference of the clamp 7, and a surface positioned close to the inner side than the groove serves as a horizontal surface 74 facing the ceiling plate 32 with a slight gap therebetween. A ring-shaped elastic member 75 is provided in the groove 73 of the clamp 7, and screws 8 are inserted from the top surface of the protruded portion 311 of the base plate 31 and screwed to screw holes 81 of the outer portion 72 of the clamp 7. The base plate 31 and the ceiling plate 32 are joined to each other by the screws 8 at a plurality of locations, e.g., eight locations as illustrated in the above-described embodiment, and the screws 8 are equi-spaced apart from each other in the circumferential direction of the shower plate 30.

As the screw 8 is tightened, the clamp 7 approaches the shower plate 30 and, thus, the elastic member 75 is pressed and deformed. The ceiling plate 32 is press-connected to the base plate 31 by the elastic restoring force of the elastic member 75. The thickness of the outer portion 72 of the clamp 7 and the depth of the groove 73 are set such that, when the protruded portion 311 of the base plate 31 contacts with the outer portion 72 of the clamp 7, a proper pressing force can be obtained between the base plate 31 and the ceiling plate 32 by the elastic restoring force (resilience force) of the elastic member 75. Therefore, after the base plate 31 and the clamp 7 contact with each other by tightening the screws 8, a slight torque can be applied to ensure the contact therebetween, so that the proper pressing force can be obtained between the base plate 31 and the ceiling plate 32. A size of each part can be set in advance such that the bottom surface (stop surface) of a head 80 of the screw 8 contacts with the base plate 31 when the proper pressing force is obtained. The material and the structure of the elastic member 75 may be the same as those described in the above embodiment.

A temperature control mechanism is installed at a position higher than that of the shower plate 30, e.g., at a wall of the processing chamber 1, and the temperature of the ceiling plate 32 is controlled to a temperature suitable for processing via the base plate 31. Hence, it is desirable to control the temperature of the clamp 7 to a proper temperature. Further, in order to form an electric field of high uniformity, it is desirable to supply a high frequency power to the base plate 31 via the clamp 7. In the present embodiment, such demand, i.e., desired thermal conduction and electrical contact can be achieved by allowing the clamp 7 and the base plate 31 to contact with each other without a gap therebetween. Thus, it is desirable to prevent a thermal expansion difference from being produced therebetween. In view of this, the clamp 7 is made of a material same as that of the base plate 31. In this embodiment, aluminum is used.

The gap between the horizontal surface 74 of the inner portion 71 of the clamp 7 and the ceiling plate 32 may be set to be, e.g., about 0.1 mm to about 1 mm, and more desirably set to be, e.g., about 0.2 mm or less, to suppress deterioration of the elastic member by preventing entrance of the plasma. Furthermore, the distance from the inner side of the inner portion 71 to the groove 73 may be set to be, e.g., about 10 mm or above. In this embodiment, the distance is set to be about 20 mm. A joining member in claims may include the clamp 7 and the screw 8 in this embodiment.

In the present embodiment, the base plate 31 and the ceiling plate 32 are press-connected to each other by the elastic restoring force of the elastic member 75 interposed between the clamp 7 and the ceiling plate 32. Hence, the torque of the screws 4 can be easily controlled compared to a case where the elastic member 75 is not interposed, and the pressing force between the base plate 31 and the ceiling plate 32 can be set to be a proper level without being affected by assembly errors. Although the clamp 7 and the ceiling plate 32 are made of different materials, the gap formed therebetween can prevent friction caused by the thermal expansion difference. As a consequence, dispersion of particles into the processing atmosphere can be prevented.

Figure 8:
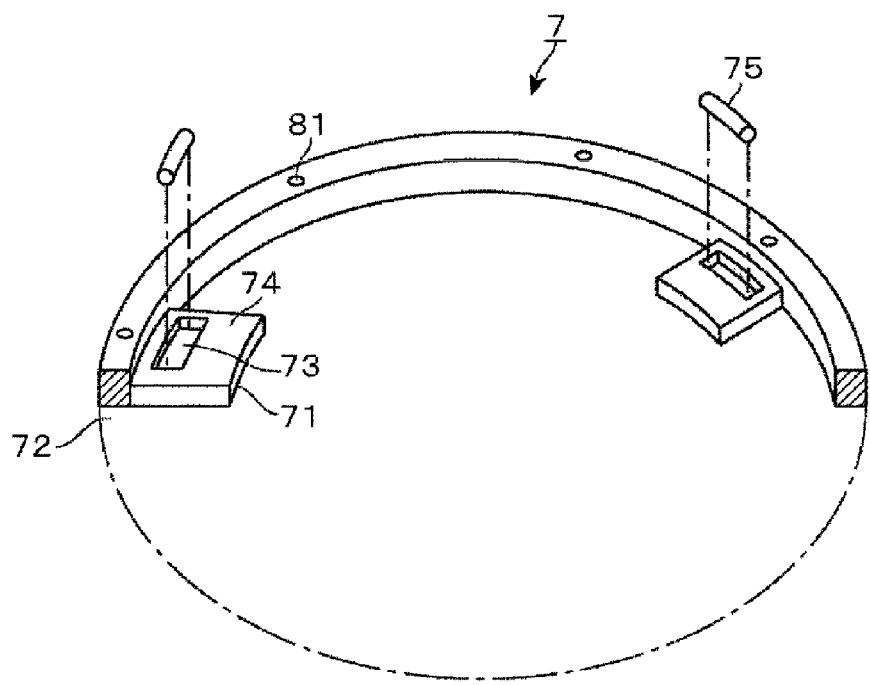
FIG. 8 is an exploded perspective view showing still another example of the gas shower structure.
Figure 9:
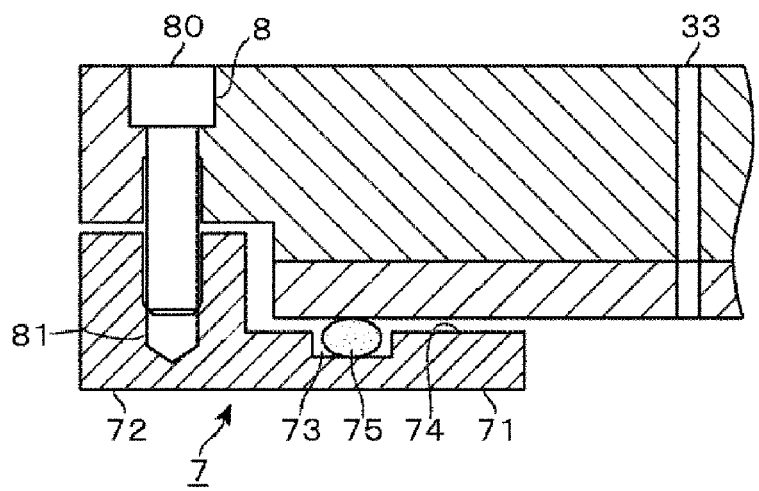
FIG. 9 is a longitudinal cross sectional view showing still another example of the gas shower structure.
Figure 10:
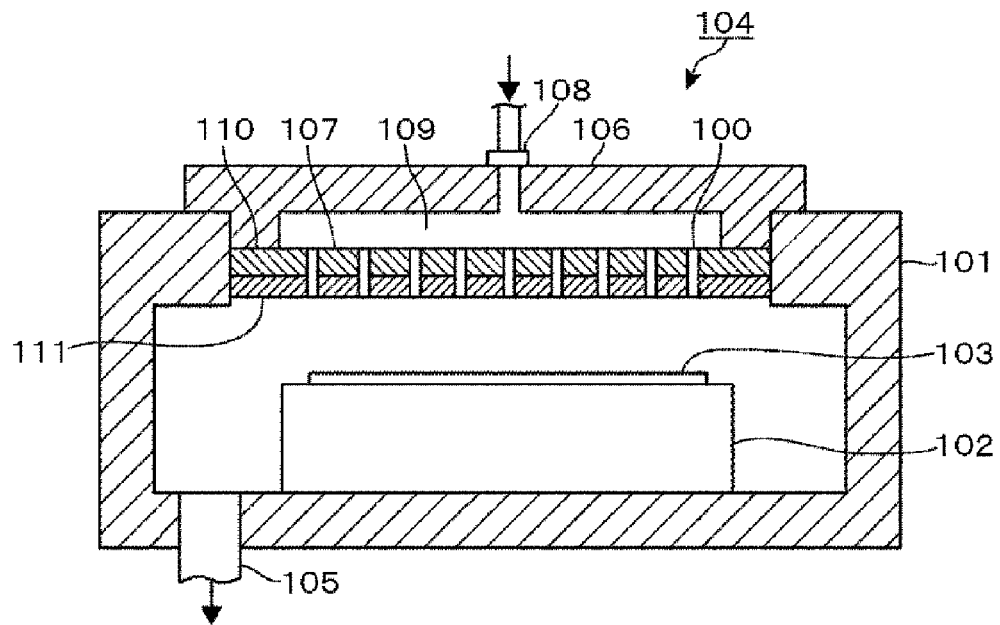
FIG. 10 schematically shows an example of a conventional substrate processing apparatus.
Figure 11A:
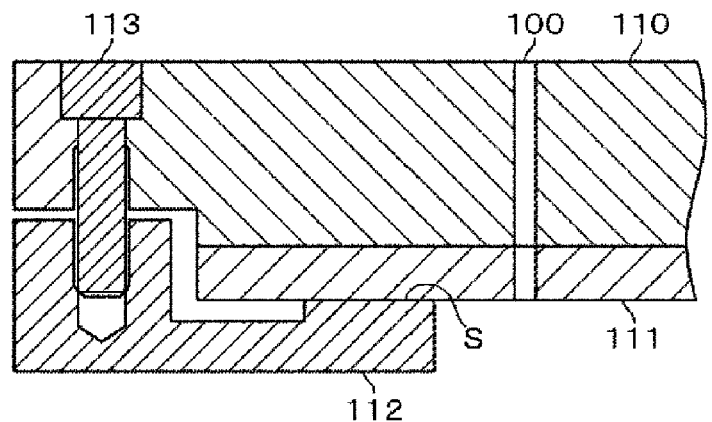
FIGS. 11A and 11B are longitudinal cross sectional views of a conventional gas shower structure.
Figure 11B:
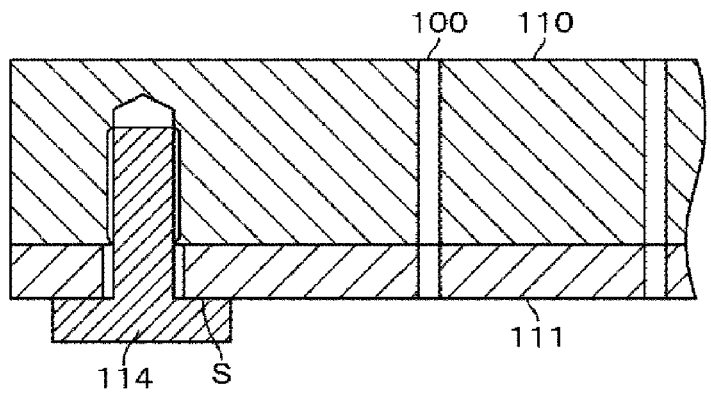

As illustrated in FIGS. 8 and 9, the clamp 7 may have a plurality of inner portions equi-spaced apart from each other along the circumferential direction instead of a single inner portion formed along the entire circumference. Further, grooves 73 accommodating therein elastic members 75 may be formed as recesses, and the elastic members 75 may have a shape that can be inserted into the grooves (recesses) 73. In this example, like parts are indicated by like reference numerals used in FIGS. 6 and 7. In addition, the present disclosure is not limited to the plasma processing apparatus, and may also be applied to an apparatus for performing a process without using plasma, e.g., a thermal CVD process or the like. Besides, the processing atmosphere may be a pressurized atmosphere other than a depressurized atmosphere.

What is claimed is:

1. A gas shower structure that is provided to face a substrate within a processing chamber and supplies a processing gas to the substrate as in a shower device, the structure comprising:
    a plate-shaped member disposed so as to be exposed to a processing atmosphere and having a plurality of gas discharge holes;
    a base member stacked on and press-connected to the plate-shaped member and having gas discharge holes at positions corresponding to positions of the gas discharge holes of the plate-shaped member;
    a joining member for press-connecting the plate-shaped member sandwiched between the joining member and the base member to the base member; and
    a press-connecting elastic member interposed between the joining member and a lowest bottom surface of the plate-shaped member, and deformed to have an elastic restoring force when the joining member approaches the plate-shaped member,
    wherein the plate-shaped member is press-connected to the base member by the elastic restoring force of the press-connecting elastic member,
    the elastic restoring force of the press-connecting elastic member is applied to the lowest bottom surface of the plate-shaped member,
    a gap is formed between the joining member and the lowest bottom surface of the plate-shaped member,
    the joining member includes a flat portion and a shaft which is protruded from a center of the flat portion,
    the shaft has a diameter smaller than that of the flat portion,
    a ring-shaped groove is formed on a surface of the flat portion on a side of the shaft, and
    the press-connecting elastic member is provided within the ring-shaped groove, and
    wherein the flat portion is covered by a cover made of a material capable of protecting the joining member from being damaged by the processing atmosphere,
    an outer side surface of the flat portion is inclined so that an upper portion of the outer side surface is protruded outwards, and an inner side surface of the cover is inclined so that an upper portion of the inner side surface is protruded inwards, such that the outer side surface of the flat portion and the inner side surface of the cover are inclined when viewed along an axis direction of the shaft of the joining member,
    a topmost surface of the flat portion and a topmost surface of the cover are in a co-planar relationship, and
    a cover elastic member for absorbing a thermal expansion difference between the joining member and the cover is interposed between the outer side surface of the flat portion and the inner side surface of the cover with the cover elastic member being in contact with the outer side surface of the flat portion that is inclined and the inner side surface of the cover that is inclined, and is entirely nested below the topmost surfaces of the flat portion and the cover.

2. The gas shower structure of claim 1, wherein the joining member is screwed to the base member, and
    the press-connecting elastic member is interposed between the flat portion and the plate-shaped member.

3. The gas shower structure of claim 2, wherein the press-connecting elastic member is formed in a ring shape so as to surround the shaft.

4. The gas shower structure of claim 2, wherein the joining member is made of a metal.

5. The gas shower structure of claim 4, wherein a surface layer of the cover elastic member is made of a material capable of protecting the joining member from the processing atmosphere.

6. The gas shower structure of claim 1, wherein the substrate is processed by plasma and the gap is smaller than or equal to about 0.2 mm.

7. The gas shower structure of claim 1, wherein the press-connecting elastic member is formed by coating fluorine resin around an elastic core.

8. A substrate processing apparatus comprising:
    a processing chamber accommodating therein a substrate mounting table;
    a gas shower structure as claimed in claim 1 disposed to face the substrate mounting table;
    a gas supply unit for supplying a processing gas through gas discharge holes of the gas shower structure; and
    a vacuum exhaust unit for exhausting an inside of the processing chamber.

* * * * *